United States Patent
Kim et al.

(10) Patent No.: US 9,474,170 B2
(45) Date of Patent: Oct. 18, 2016

(54) ELECTRONIC CONTROL APPARATUS FOR VEHICLE USING WATER PROOF TYPE HOUSING SEALING AND METHOD THEREOF

(71) Applicant: Hyundai Autron Co., Ltd., Seongnam-si (KR)

(72) Inventors: Chang Ju Kim, Uijeongbu-si (KR); Chang Geun Shin, Yongin-si (KR); Dong Gi Lee, Incheon (KR); Jun Ho Lee, Seoul (KR); Yeon Chul Choo, Seoul (KR)

(73) Assignee: HYUNDAI AUTRON CO., LTD., Seongnam-Si (KR)

( * ) Notice: Subject to any disclaimer, the term of this patent is extended or adjusted under 35 U.S.C. 154(b) by 0 days.

(21) Appl. No.: 14/139,846

(22) Filed: Dec. 23, 2013

(65) Prior Publication Data

US 2014/0321079 A1     Oct. 30, 2014

(30) Foreign Application Priority Data

Apr. 26, 2013   (KR) .......................... 10-2013-0046940

(51) Int. Cl.
  *H05K 5/00*    (2006.01)
  *B60R 16/023*  (2006.01)
  (Continued)

(52) U.S. Cl.
  CPC ........... *H05K 5/0026* (2013.01); *B60R 16/023* (2013.01); *B60R 16/0231* (2013.01);
  (Continued)

(58) Field of Classification Search
  CPC ................................. H05K 5/06; H05K 5/062
  See application file for complete search history.

(56) References Cited

U.S. PATENT DOCUMENTS 3,921,685 A * 11/1975 Steffes .................... F02B 55/08
                                                          141/310
2002/0154486 A1* 10/2002 Koike .................. H05K 5/0073
                                                          361/704

(Continued)

FOREIGN PATENT DOCUMENTS

CH   CA 2547793 A1 *  6/2005  ............. H01G 2/103
CN      202679870 U     1/2013

(Continued)

OTHER PUBLICATIONS

Office Action, Korea Intellectual Property Office, Apr. 21, 2014.

(Continued)

*Primary Examiner* — Zachary M Pape
*Assistant Examiner* — Douglas Burtner
(74) *Attorney, Agent, or Firm* — Mayer Brown LLP; Hyunho Park

(57) ABSTRACT

The present disclosure relates to an electronic control apparatus for a vehicle using waterproof type housing sealing and a manufacturing method thereof, in which when a connector cover including a sealing material injection hole formed on a front surface is coupled with a body coupling part, a sealing space is formed along a circumference of an inner surface of each of the coupled coupling parts and a preventive protrusion formed at a body coupling part, and a sealing material is injected through a sealing material injection hole so that a sealing space between the connector cover and a housing body is sealed, thereby improving waterproof performance between the connector cover and the housing body, and simplifying a process by replacing a process of manufacturing and mounting an O-ring in advance with a simple process of injecting the sealing material.

6 Claims, 5 Drawing Sheets

(51) Int. Cl.
  *H05K 5/06* (2006.01)
  *H05K 3/30* (2006.01)
(52) U.S. Cl.
  CPC ....... *B60R16/0232* (2013.01); *B60R 16/0233* (2013.01); *B60R 16/0234* (2013.01); *B60R 16/0235* (2013.01); *B60R 16/0236* (2013.01); *B60R 16/0237* (2013.01); *B60R 16/0238* (2013.01); *B60R 16/0239* (2013.01); *H05K 3/30* (2013.01); *H05K 5/0039* (2013.01); *H05K 5/06* (2013.01); *H05K 5/062* (2013.01); *Y10T 29/49147* (2015.01)

(56) References Cited

U.S. PATENT DOCUMENTS

| | | | | |
|---|---|---|---|---|
| 2004/0075989 | A1* | 4/2004 | Wong | H05K 5/062 361/752 |
| 2007/0218721 | A1* | 9/2007 | Naritomi | H02G 3/088 439/131 |
| 2008/0053700 | A1* | 3/2008 | O'Connor | B23K 20/122 174/564 |
| 2012/0320544 | A1* | 12/2012 | Ohhashi | H05K 5/0052 361/752 |
| 2013/0058059 | A1* | 3/2013 | Min | H05K 9/0026 361/756 |
| 2013/0120943 | A1* | 5/2013 | Tamura | H05K 5/0052 361/752 |

FOREIGN PATENT DOCUMENTS

| | | | | |
|---|---|---|---|---|
| GB | 2115084 | A | * 9/1983 | F16J 15/14 |
| JP | 2006108040 | A | 4/2006 | |
| JP | 2007269220 | A | 10/2007 | |
| JP | 2009123558 | A | 6/2009 | |
| JP | 2010062220 | A | 3/2010 | |

OTHER PUBLICATIONS

State Intellectual Property Office of the P.R.C., Office Action for Chinese patent application No. 201310706196.1, Jun. 1, 2016, China.

* cited by examiner

ELECTRONIC CONTROL APPARATUS FOR VEHICLE USING WATER PROOF TYPE HOUSING SEALING AND METHOD THEREOF

CROSS-REFERENCE TO RELATED APPLICATIONS

This application is based on and claims priority from Korean Patent Application No. 10-2013-0046940, filed on Apr. 26, 2013, with the Korean Intellectual Property Office, the disclosure of which is incorporated herein in its entirety by reference.

TECHNICAL FIELD

The present disclosure relates to an electronic control apparatus for a vehicle, and more particularly, to an electronic control apparatus having a tight sealing structure between a housing body and a connector cover in an electronic control apparatus, such as an electronic control unit (ECU) of an engine, of a vehicle.

BACKGROUND

In general, an electronic control apparatus such as an ECU, which electronically controls various types of devices, is equipped in a vehicle. The electronic control apparatus receives information from sensors or switches installed at each part of the vehicle. The electronic control apparatus serves to perform various electronic controls for promoting improvement of a riding quality and safety of the vehicle or providing various items of convenience to a driver and a passenger by processing the received information.

For example, the electronic control apparatus such as the ECU, which controls states of an engine, an automatic transmission, an anti-lock brake system (ABS), and the like in the vehicle using a computer, also serves to control all parts in the vehicle, such as a driving system, a braking system, and a steering system as well as the automatic transmission as the vehicle and the computer have been developed in terms of performance.

The electronic control apparatus such as the ECU has a structure that includes a case which includes an upper cover and a lower base, a printed circuit board (PCB) which is accommodated in the case, a connector which is coupled to a front end of the PCB so as to be connected to an external socket, and the like.

The cover and the base are assembled together with the PCB while covering the PCB, and particularly, the connector, which is interposed between the cover and the base when the cover and the base are assembled, forms a sealing structure with the cover side and the base side.

The electronic control apparatus includes a high integrated control circuit means and thus requires a predetermined sealing structure that may prevent external moisture or foreign substances from flowing into the electronic control apparatus, and the electronic control apparatus mainly adopts a sealing structure in which the cover and the base are typically assembled together with the connector in a state in which sealing materials are inserted on binding parts between the cover and the base and the connector so as to protect the PCB and the like in the electronic control apparatus.

However, the sealing structures applied to the electronic control apparatus in the related art mostly have a structure in which a sealing member is applied on a connected portion between a groove or protrusion at the connector side and a protrusion or a groove at the cover side and the base side, so that it fails to secure a sufficient sealing area, and as a result, there is a difficulty in securing a sealing quality of an assembled portion between the connector, and the cover and the base.

A slot type electronic control apparatus has a sealing structure in which an O-ring is inserted between a housing body and a cover.

FIG. 1A shows a diagram illustrating an example of coupling of an electronic control apparatus including a slot type housing in the related art, and FIG. 1B shows a perspective view of an O-ring used in the electronic control apparatus of FIG. 1A.

As illustrated in FIG. 1A, the electronic control apparatus including the slot type housing in the related art includes a housing body 110, a cover 120, a connector 130, and a PCB 140.

The housing body 110 is a slot type body among existing various types of housings.

The connector 130 includes an inner pin and an outer pin, and is coupled with the cover 120.

The cover 120 is coupled with the PCB 140, and a slot formed by the PCB 140 is coupled with the housing body 110. Here, an O-ring 121 is inserted before the housing body 110 is coupled with the cover 120.

That is, in a case of the waterproof slot type housing in the related art, the O-ring 121 is inserted between the housing body 110 and the cover 120. The housing body 110 is in close contact with the cover 120 so that a coupled region between the housing body 110 and the cover 120 is sealed. Accordingly, the O-ring 121 suitable to the cover 120 needs to be manufactured in advance before the housing body 110 is coupled with the cover 120, and the manufactured O-ring 120 needs to be mounted inside the cover 120.

SUMMARY

The present disclosure has been made in an effort to provide an electronic control apparatus for a vehicle using waterproof type housing sealing and a manufacturing method thereof, in which when a connector cover including a sealing material injection hole formed on a front surface is coupled with a body coupling part, a sealing space is formed along a circumference of an inner surface of each of the coupled coupling parts and a preventive protrusion formed at the body coupling part, and a sealing material is injected through the sealing material injection hole so that a sealing space between the connector cover and a housing body is sealed, thereby improving waterproof performance between the connector cover and the housing body, and simplifying a process by replacing a process of manufacturing and mounting an O-ring in advance with a simple process of injecting the sealing material An exemplary embodiment of the present disclosure provides an electronic control apparatus for a vehicle, including: a printed circuit board (PCB) configured to electrically control each part of the vehicle; a connector cover including a connector part electrically connected with the PCB and a cover coupling part including a sealing material injection hole, through which a sealing material is injected, and coupled with the PCB through the connector part; and a housing body including a body part configured to accommodate the PCB and the body coupling part fitted to and coupled with the cover coupling part in a slot type, and including a preventive protrusion formed along a circumference of an inner surface of the body coupling part, in which the cover coupling part is engaged and coupled with the body coupling part, and a sealing space is formed along a circumference of an inner surface of each of the coupled coupling parts and the formed preventive protrusion, and the sealing material is injected into the formed sealing material injection hole so that the sealing space between the coupling parts, at which the connector cover is coupled with the housing body, is sealed.

The connector cover may include a plurality of sealing material injection holes, through which the sealing material is injected, on a front surface thereof, and the sealing material may be injected through each of the plurality of formed sealing material injection holes.

The preventive protrusion formed at the body coupling part may have an inclined internal surface facing an inner surface of the coupled cover coupling part.

At least one surface among inner surfaces of the cover coupling part, the inner surface of the body coupling part, and the internal surface of the formed preventive protrusion within the sealing space formed along the circumference of the inner surface of each of the body coupling part and the cover coupling part, which are coupled with each other, and the formed preventive protrusion may be formed by a groove.

Another exemplary embodiment of the present disclosure provides a method of manufacturing an electronic control apparatus, including: coupling a connector cover with a printed circuit board (PCB) configured to electrically control each part of a vehicle through a formed connector, the connector cover including a connector electrically connected with the PCB and a sealing material injection hole, through which a sealing material is injected, formed on a front surface thereof; fitting the connector cover having the connector coupled with the PCB to a housing body including a preventive protrusion formed along a circumference of an inner surface of a coupling part coupled with the connector cover in a slot type to be coupled so as to accommodate the PCB; engaging and coupling the cover coupling part with the body coupling part and forming a sealing space along a circumference of an inner surface of each of the coupled coupling parts and the formed preventive protrusion; and sealing the sealing space between the coupling parts at which the connector cover is coupled with the housing body by injecting the sealing material through the formed sealing material injection hole and hardening the sealing material.

The sealing of the sealing space may include forming a plurality of sealing material injection holes on a front surface of the connector cover and injecting the sealing material through each of the plurality of formed sealing material injection holes.

According to the exemplary embodiments of the present disclosure, when the connector cover including the sealing material injection hole formed on the front surface is coupled with the body coupling part, the sealing space is formed along the circumference of the inner surface of each of the coupled coupling parts and the preventive protrusion formed at the body coupling part and the sealing material is injected through the sealing material injection hole, so that the sealing space between the connector cover and the housing body is sealed, thereby improving waterproof performance through attachment with the sealing material.

According to the exemplary embodiment of the present disclosure, the processes of manufacturing the O-ring in advance, mounting the manufactured O-ring on the connector cover, and coupling the connector cover on which the O-ring is mounted with the housing body are simplified to the process of coupling the connector cover and the housing body and injecting the sealing material, so that there is an effect in that a process related to the O-ring may be omitted, the process may become simple, and production efficiency of the electronic control apparatus may be improved.

According to the exemplary embodiment of the present disclosure, the existing sealing material, not the O-ring or a sealing material for improving waterproof performance, is used, so that there is an effect in that it is possible to decrease efforts to separately develop a sealing material.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
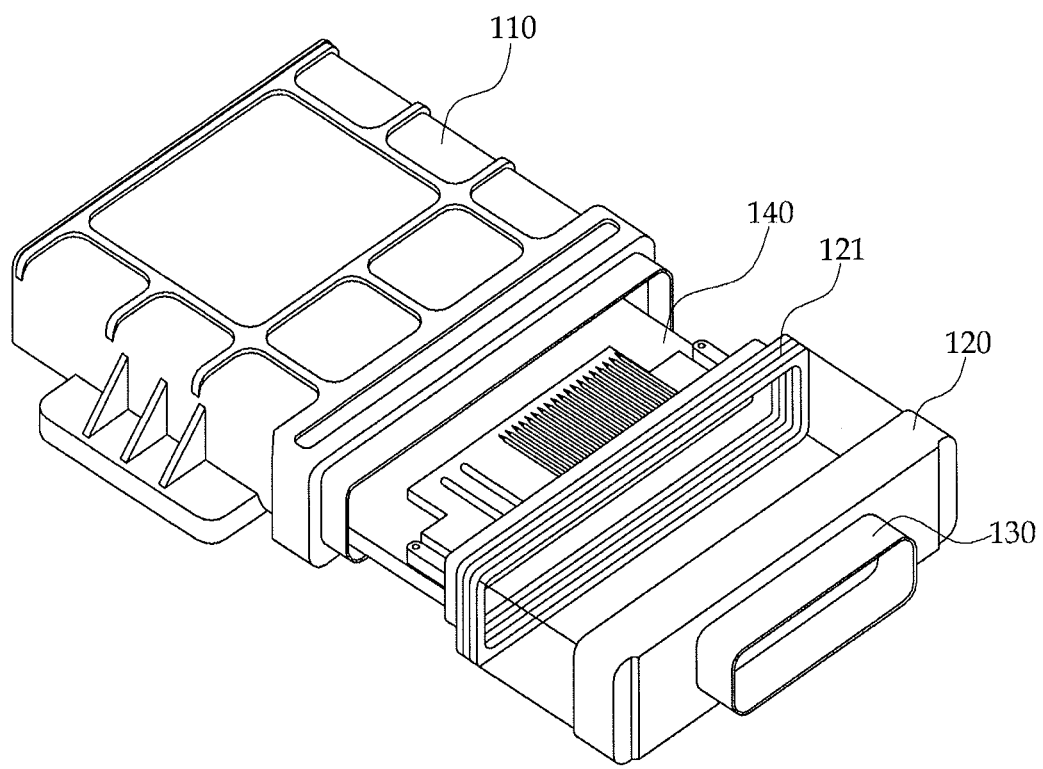
FIG. 1A shows a diagram illustrating an example of coupling of an electronic control apparatus including a slot type housing in the related art.
Figure 1B:
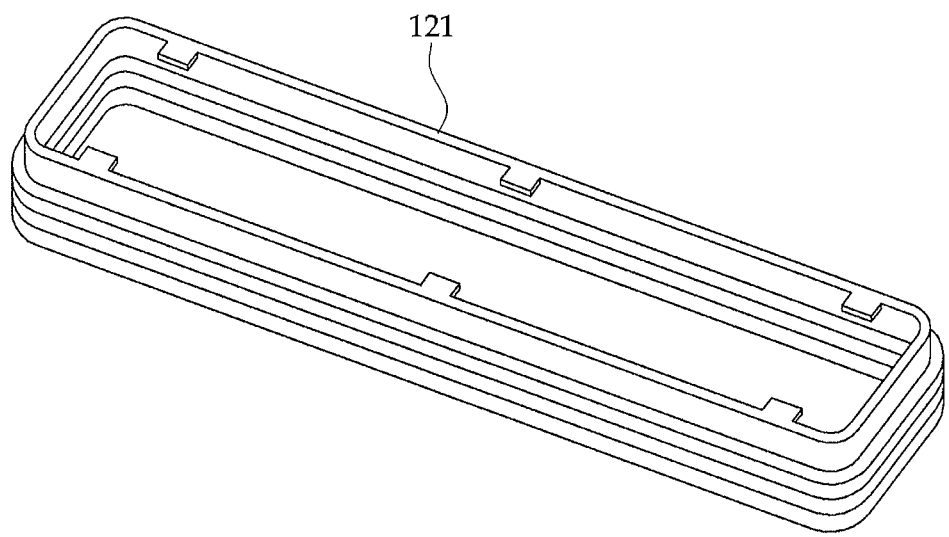
FIG. 1B shows a perspective view of an O-ring used in the electronic control apparatus in the related art.

Hereinafter, an exemplary embodiment of the present disclosure will be described in detail with reference the accompanying drawing. A configuration of the present disclosure and an operational effect thereof will be clearly understood through the detailed description below. In the following description, the same elements will be designated by the same reference numerals although they are shown in different drawings, and a detailed explanation of known related functions and constitutions may be omitted when it is determined that the detailed explanation obscures the subject matter of the present disclosure.

Figure 2:
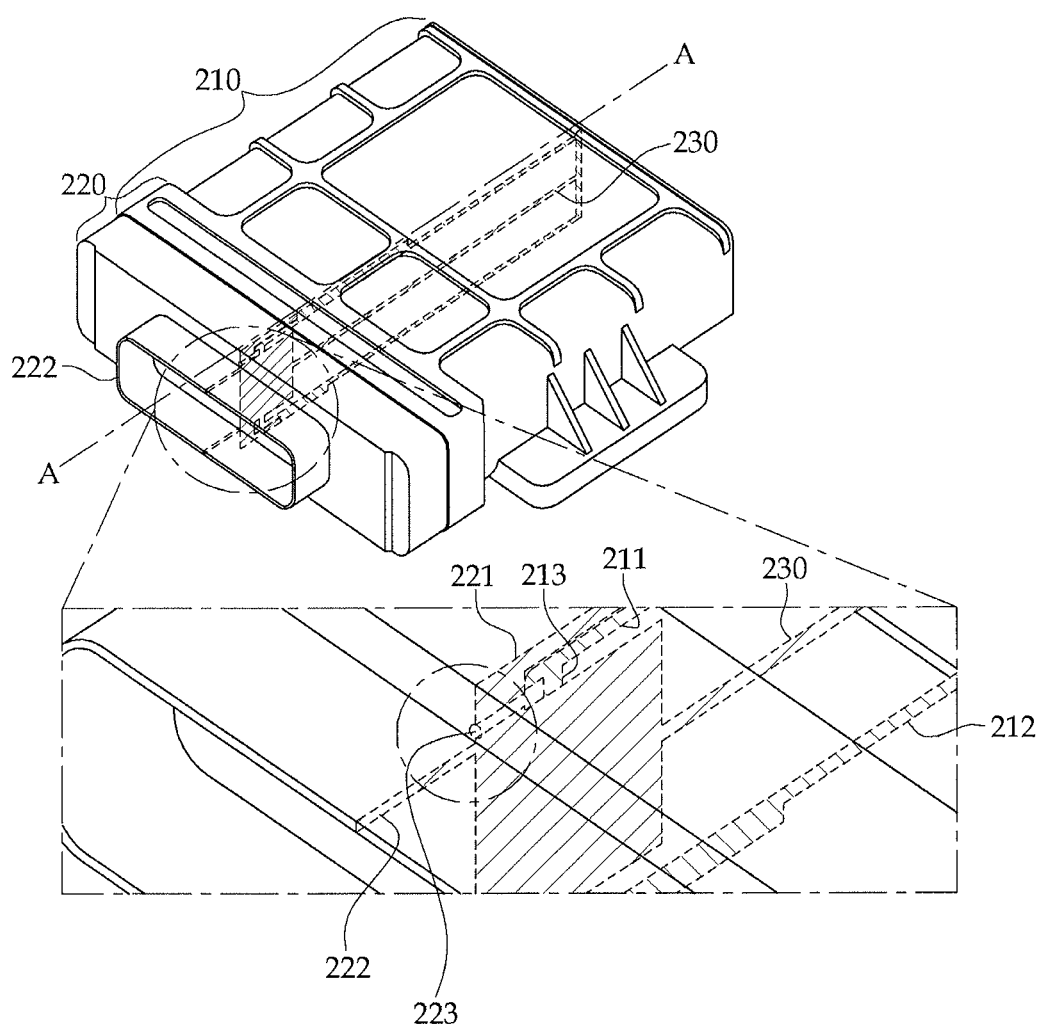
FIG. 2 shows a perspective view of an electronic control apparatus for a vehicle using a waterproof connector cover according to an exemplary embodiment of the present disclosure.

FIG. 2 shows a perspective view of an electronic control apparatus for a vehicle using a waterproof connector cover according to an exemplary embodiment of the present disclosure.

The electronic control apparatus is a component equipped with an electronic control element, for example, an integrated control circuit means, such as a PCB 230, electrically controlling each part of the vehicle, and requires a tight sealing structure for preventing external moisture or foreign substances from flowing into the inside. To this end, the electronic control apparatus has a form of a waterproof slot type housing.

As illustrated in FIG. 2, the electronic control apparatus includes a housing body 210, a connector cover 220, and a PCB 230. Herein, the connector cover 220 includes a cover coupling part 221 and a connector part 222. The housing body 210 includes a body part 212 and a body coupling part 211.

The housing body 210 includes the body coupling part 211 fitted to and coupled with the cover coupling part 221 accommodating the electronic control element in a slot type, and the body part 212. The housing body 210 includes a preventive protrusion 213 formed along a circumference of an inner surface of the body coupling part 211.

Here, the housing body 210 and the connector cover 220 are coupled with each other in the slot type. The connector cover 220 is coupled with the housing body 210 in the slot type while accommodating the PCB 230 and the like therein.

In the connector cover 220, the cover coupling part 221 may be integrally formed with the connector part 222 for waterproofing. The cover coupling part 221 is coupled with the body coupling part 211 of the housing body 210.

The connector part 222 is coupled with and electrically connected to the PCB 230. The connector part 222 includes a connector pin, and is electrically connected with the PCB 230 through the connector pin. The connector pin may include a plurality of inner pins for connection with the internal PCB 230, and a plurality of outer pins for connection with the outside. The connector part 222 may be physically fitted to and coupled with the PCB 230, and may electrically connect the PCB 230 with the inner pin. The connector part 222 may be formed in an integrated form of a front end portion and a rear end portion exposed to the outside.

The PCB 230 may include an electric element, a heating element, or a heat radiating plate at a top side or a bottom side. The connector cover 220 is connected with the connector part 222 at the outside thereof, and is connected with the PCB 230 inside the housing.

The sealing structure will be described. A sealing material injection hole 223, through which a sealing material is injected, is formed in the cover coupling part 221. The cover coupling part 221 is engaged with the body coupling part 211. A sealing space 201 is formed along the circumstance of the inner surface of each of the coupled coupling parts 211 and 221 and the preventive protrusion 213 formed in the body coupling part 211. When the sealing material is injected through the sealing material injection hole 223 formed on a front surface of the body coupling part 211, sealing is performed in the sealing space 201 between the coupling parts 211 and 221 in which the connector cover 220 is coupled with the housing body 210. Here, a plurality of sealing material injection holes 223, through which the sealing material is injected, may be formed on a front surface of the cover coupling part 221 of the connector cover 220. When the sealing material is hardened and the sealing is performed, the sealing material may be injected through each of the plurality of previously formed sealing material injection holes 223.

When the connector cover 220 is coupled with the housing body 210 in the slot type, the tight sealing may be achieved through the sealing material injected into the sealing space 201 through the sealing material injection holes 223. That is, the connector cover 220 and the housing body 210 may have a waterproof type through the injection of the sealing material without manufacturing an O-ring. Accordingly, it is not necessary to mount an O-ring in the connector cover 220 in advance before the connector cover 220 is coupled with the housing body 210.

To this end, the sealing space 201 filled with the sealing material in the connector cover 220 may be formed in various types of space according to forms of the inner surface of each of the cover coupling part 221 and the body coupling part 211 and the preventive protrusion 213. For example, the sealing space 201 may be formed in a square surface form in which upper, lower, left, and right surfaces face each other, or a concave form in which upper, lower, left, and right surfaces are curved illustrated in FIG. 2.

The sealing space 201 having the square surface form will be described. The sealing space 201 has a sealing structure in which sealing is performed in portions in which the cover coupling part 221 meets the body coupling part 211, that is, portions in which the inner surfaces of each of the cover coupling part 221 and the body coupling part 211 are in contact with each other in parallel while facing each other in up, down, left, and right directions when the cover coupling part 221 is coupled with the body coupling part 211. It is possible to secure a sufficient sealing space (sealing area) in the sealing structure adopting a surface-to-surface method. Sealing performance may be improved through enlargement of a sealing section, thereby promoting stability of a quality. The preventive protrusion 213 formed in the body coupling part 211 may have an inclined internal surface which faces the inner surface of the coupled cover coupling part 221.

In the meantime, at least one surface among the inner surface of the cover coupling part 221, the inner surface of the body coupling part 211, and the internal surface of the preventive protrusion 213 within the sealing space formed along the circumference of the inner surface of each of the cover coupling part 221 and the body coupling part 211, which are coupled with each other, and the preventive protrusion 213 may be formed by a groove shaped like a curved surface.

As illustrated in the detailed drawing of FIG. 2, the sealing material injection hole 223 is positioned on the front surface of the cover coupling part 221. The sealing material injection hole 223 may have a circular or polygonal opening. The sealing material injection hole 223 may be shaped like a circular or polygonal pipe from the opening formed on the front surface of the connector cover 220 to the sealing space 201.

The sealing structure including the sealing space 201 will be described in detail with reference to FIG. 3.

Figure 3:
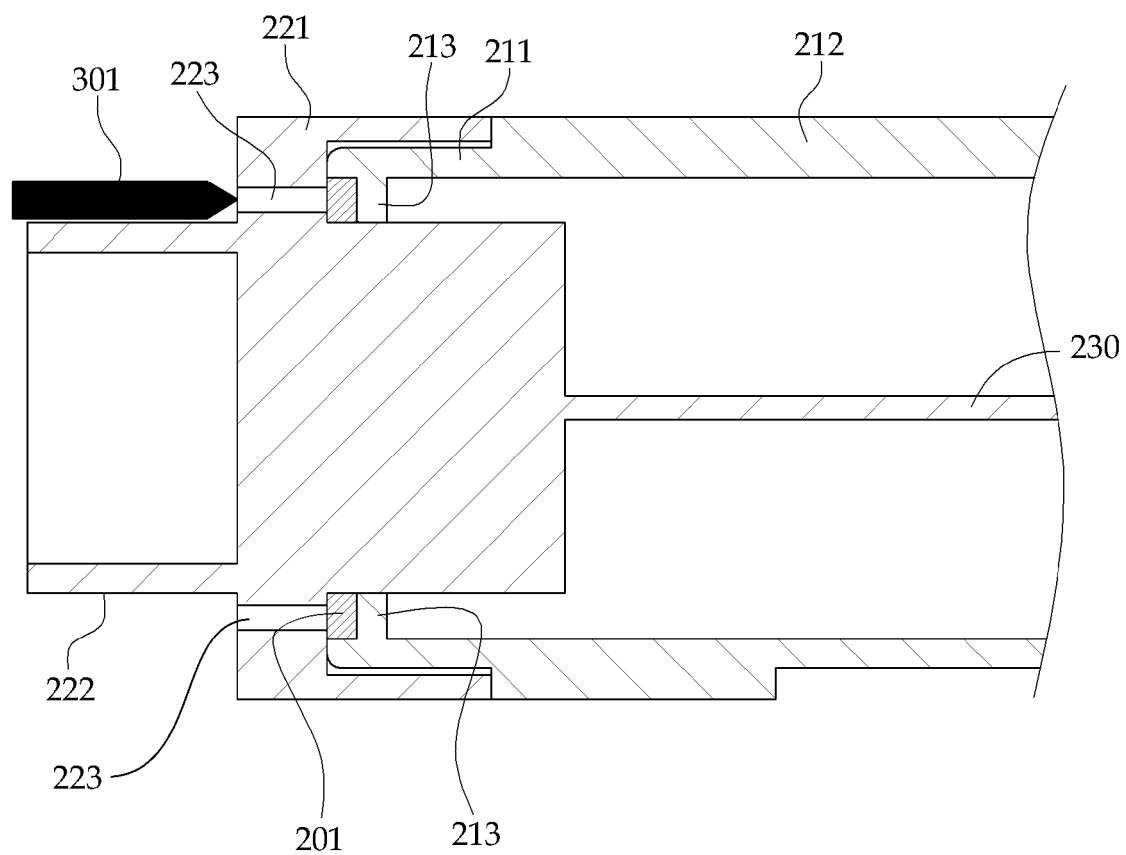
FIG. 3 shows a cross-sectional view of the electronic control apparatus for the vehicle taken along line A-A illustrated in FIG. 2 of the present disclosure.

FIG. 3 shows a cross-sectional view of the electronic control apparatus for a vehicle taken along line A-A illustrated in FIG. 2 of the present disclosure.

As illustrated in FIG. 3, the cover coupling part 221 is fitted to the body coupling part 211 in a slot type to be coupled with each other.

Here, the preventive protrusion 213 shaped like a band connecting over the entire section of the circumference protrudes from the circumference of the inner surface of the body coupling part 211. The circumference of the inner surface of the cover coupling part 221, that is, the circumference of the internal surface of the cover coupling part 221, which is in contact with the body coupling part 211, is coupled with a surface facing the preventive protrusion 213. In this case, based on a state in which the preventive protrusion 213 formed in the body coupling part 211 is coupled with the inner surface of the cover coupling part 221, the preventive protrusion 213 formed in the body coupling part 211 and the inner surface of the cover coupling part 221 may be positioned while maintaining a predetermined interval in a front and rear longitudinal direction.

Accordingly, a predetermined space by a spaced distance, that is, the sealing space 201 having a cross-section surrounded by the inner surface and the preventive protrusion 213 in the left and right directions and surrounded by the inner surface of the cover coupling part 221 and the inner surface of the body coupling part 211 in the up and down directions, may be formed between the inner surface of the cover coupling part 221 and the preventive protrusion 213 of the body coupling part 211.

In the meantime, the sealing material injection hole 223 is formed on the front surface of the body coupling part 211. The sealing material is injected into the sealing space 201 via the sealing material injection hole 223 through a nozzle 301. Then, the sealing material is hardened and the sealing material injection hole 223 is sealed with a sealing material, so that the sealing is performed between the cover coupling part 221 and the body coupling part 211. That is, the cover coupling part 221 is coupled with the body coupling part 211, and the sealing material is injected through the sealing material injection hole 223 positioned on the front surface of the cover coupling part 221 to perform sealing between the cover coupling part 221 and the body coupling part 211, so that when the O-ring is inserted into the coupling part between the existing cover and housing body, the space between the cover and the housing body may be more conveniently sealed, and thus a quality may be stabilized through the simplification of the sealing process. The sealing material injected into the sealing space 201 is blocked by the inner surfaces of the cover coupling part 221 and the body coupling part 211 and the preventive protrusion 213, thereby being prevented from overflowing into the outside.

Accordingly, the sealing material injected into the sealing space 201 may completely block the internal spaces of the connector cover 220 and the housing body 210 over the entire circumference section of the sealing space 201 from the outside while maintaining a predetermined width. Accordingly, it is possible to secure stable sealing performance. There is no sealing material overflowing into the outside, so that it is also possible to improve a quality of sealing.

Figure 4:
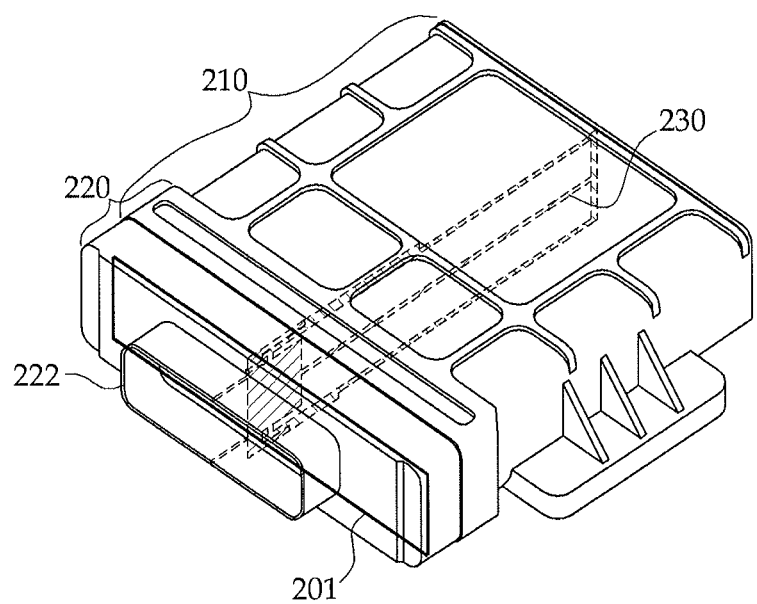
FIG. 4 shows a perspective view of the electronic control apparatus in which sealing is completed by injecting a sealing material according to the exemplary embodiment of the present disclosure.

FIG. 4 shows a perspective view of the electronic control apparatus in which sealing is completed by injecting the sealing material according to the exemplary embodiment of the present disclosure.

As illustrated in FIG. 4, when the sealing material is injected through the sealing material injection hole 223 formed on the front surface of the connector cover 220 between the connector cover 220 and the housing body 210 in the electronic control apparatus, the sealing material is fully filled in a designed path and is hardened. Through the sealing material hardening process, the coupling parts 221 and 211 of the connector cover 220 and the housing body 210 of the electronic control apparatus are sealed.

The electronic control apparatus according to the exemplary embodiment of the present disclosure adopts the method in which the sealing material is injected through the sealing material injection hole 223 after the housing body is coupled with the connector cover to seal the sealing space between the housing body and the connector cover, not a method of manufacturing and mounting the O-ring in advance, and then coupling the housing body and the connector cover.

According to the present disclosure, when the connector cover including the sealing material injection hole on the front surface is coupled with the body coupling part, the sealing space is formed along the circumference of the inner surface of each of the coupled coupling parts and the preventive protrusion formed at the body coupling part, and the sealing material is injected through the sealing material injection hole so that the sealing space between the connector cover and the housing body is sealed, thereby improving waterproof performance between the connector cover and the housing body, and simplifying a manufacturing process by replacing the process of manufacturing and mounting the O-ring in advance with the simple process of injecting the sealing material. In this point, since the present disclosure that is beyond the limit of the known art does not just utilize the related art but commercial or business possibility of equipment, to which the present disclosure is applied, is sufficient and can be clearly carried out in practice, the present disclosure has industrial applicability.

From the foregoing, it will be appreciated that various embodiments of the present disclosure have been described herein for purposes of illustration, and that various modifications may be made by those skilled in the art without departing from the scope and spirit of the present disclosure. Accordingly, the various embodiments disclosed herein are not intended to be limiting. The scope of the present disclosure shall be construed on the basis of the following claims in such a manner that all of the technical ideas included within the scope equivalent to the claims belong to the present disclosure.

What is claimed is:

1. An electronic control apparatus for a vehicle, comprising:
a printed circuit board (PCB) configured to electrically control each part of the vehicle;
a connector cover including a connector part electrically connected with the PCB and a cover coupling part including a sealing material injection pipe, through which a sealing material is injected, and coupled with the PCB through the connector part; and
a housing body including a body part configured to accommodate the PCB and a body coupling part fitted to and coupled with the cover coupling part, and including a preventive protrusion along a circumference of an inner surface of the body coupling part,
wherein the cover coupling part is engaged and coupled with the body coupling part, and a sealing space is formed between the cover coupling part and the body coupling part along a circumference of an inner surface of each of the cover coupling part, the body coupling part, and the preventive protrusion,
wherein the sealing space is filled with the sealing material injected through the sealing material injection pipe so that the sealing space between the cover coupling part and the body coupling part, at which the connector cover is coupled with the housing body, is sealed, and the sealing material is contained only in the sealing space and the sealing material is not contained in the sealing material injection pipe.

2. The electronic control apparatus of claim 1, wherein the connector cover includes one or more sealing material injection pipes, through which the sealing material is injected, and the sealing material is injected through each of the one or more sealing material injection pipes.

3. The electronic control apparatus of claim 1, wherein the preventive protrusion formed at the body coupling part has an inclined internal surface facing an inner surface of the coupled cover coupling part.

4. The electronic control apparatus of claim 1, wherein at least one surface among inner surfaces of the cover coupling part, the inner surface of the body coupling part, and the internal surface of the formed preventive protrusion within the sealing space formed along the circumference of the inner surface of each of the body coupling part and the cover coupling part, which are coupled with each other, and the formed preventive protrusion is formed by a groove.

5. A method of manufacturing an electronic control apparatus, comprising:

coupling a connector cover with a printed circuit board (PCB) configured to electrically control each part of a vehicle through a formed connector, the connector cover includes a connector part electrically connected with the PCB and a cover coupling part having a sealing material injection pipe, through which a sealing material is injected;

fitting the connector cover having the connector part coupled with the PCB to a housing body having a preventive protrusion formed along a circumference of an inner surface of a body coupling part coupled with the cover coupling part to accommodate the PCB;

engaging and coupling the cover coupling part with the body coupling part and forming a sealing space between the cover coupling part and the body coupling part along a circumference of an inner surface of each of the cover coupling part, the body coupling part, and the preventive protrusion; and filling the sealing space between the cover coupling part and the body coupling part, at which the connector cover is coupled with the housing body by injecting the sealing material through the sealing material injection pipe, wherein the sealing material is transferred to the sealing space through the sealing material injection pipe such that the sealing space contains all of the sealing material and the sealing material injection pipe does not contain the sealing material.

6. The method of claim 5, wherein sealing the sealing space includes forming one or more sealing material injection pipes and injecting the sealing material through each of the one or more sealing material injection pipes.

* * * * *